(12) United States Patent
Belopolsky et al.

(10) Patent No.: US 6,638,082 B2
(45) Date of Patent: Oct. 28, 2003

(54) PIN-GRID-ARRAY ELECTRICAL CONNECTOR

(75) Inventors: Yakov Belopolsky, Harrisburg, PA (US); Wayne Zahlit, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/989,648

(22) Filed: Nov. 20, 2001

(65) Prior Publication Data

US 2003/0096513 A1 May 22, 2003

(51) Int. Cl.[7] .............................. H01R 12/00; H05K 1/00
(52) U.S. Cl. ............................. 439/83; 439/68; 439/78; 439/931
(58) Field of Search .......................... 439/68, 78, 83, 439/931

(56) References Cited

U.S. PATENT DOCUMENTS

| | | | |
|---|---|---|---|
| 3,885,076 A | 5/1975 | Heidenreich et al. | 428/195 |
| 4,882,200 A | 11/1989 | Liu et al. | 427/53.1 |
| 4,882,633 A | 11/1989 | Nakatani et al. | 358/339 |
| 4,902,235 A * | 2/1990 | Tonooka | 439/72 |
| 4,977,668 A * | 12/1990 | McKenzie, Jr. | 29/852 |
| 5,073,124 A * | 12/1991 | Powell | 439/197 |
| 5,577,935 A | 11/1996 | Harting et al. | 439/581 |
| 5,590,029 A * | 12/1996 | Estes | 361/760 |
| 5,713,762 A | 2/1998 | Mitra et al. | 439/607 |
| 5,727,956 A | 3/1998 | Mitra et al. | 439/74 |
| 5,741,144 A | 4/1998 | Elco et al. | 439/101 |
| 5,743,765 A | 4/1998 | Andrews et al. | 439/608 |
| 5,929,516 A | 7/1999 | Heerman et al. | 257/701 |
| 6,042,389 A | 3/2000 | Lemke et al. | 439/74 |
| 6,083,047 A | 7/2000 | Paagman | 439/608 |
| 6,122,172 A | 9/2000 | Dumoulin et al. | 361/719 |
| 6,130,478 A | 10/2000 | Dunoulin et al. | 257/728 |
| 6,183,301 B1 | 2/2001 | Paagman | 439/608 |
| 6,241,535 B1 | 6/2001 | Lemke et al. | 439/83 |
| 6,249,048 B1 | 6/2001 | Heerman et al. | 257/701 |
| 2002/0013100 A1 * | 1/2002 | Brownell et al. | 439/625 |

FOREIGN PATENT DOCUMENTS

| EP | 0 506 260 A3 | 3/1992 |
|---|---|---|
| JP | 62 063 683 A | 3/1987 |

* cited by examiner

Primary Examiner—Michael C. Zarroli
(74) Attorney, Agent, or Firm—Woodcock Washburn LLP

(57) ABSTRACT

A presently-preferred electrical connector comprises an electrically-conductive terminal pin, and an electrically-insulative connector body comprising a first and a second substantially planar surface and a stud member. The stud member projects from the second substantially planar surface and is adapted to be mounted on a circuit substrate. The connector body has a through hole formed therein. The through hole extends from the first substantially planar surface to the stud member and is adapted to receive the terminal pin. At least a portion of the stud member is coated with an electrically conductive material adapted to establish electrical contact between the terminal pin and an electrical connection point on the circuit substrate.

22 Claims, 9 Drawing Sheets

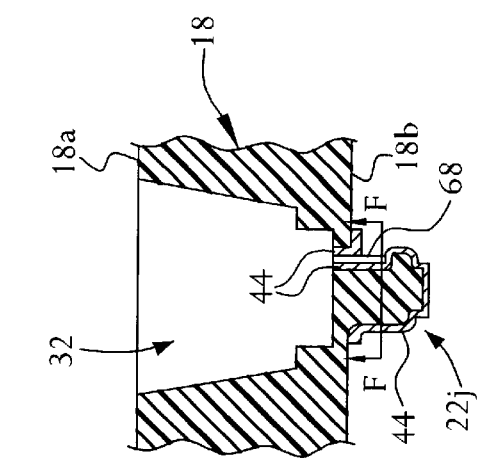
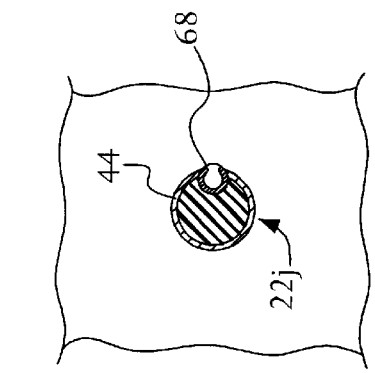
FIG. 10A
FIG. 10B
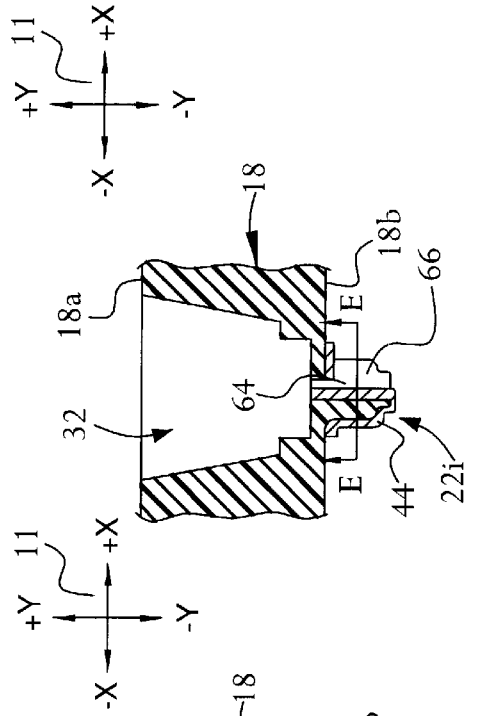
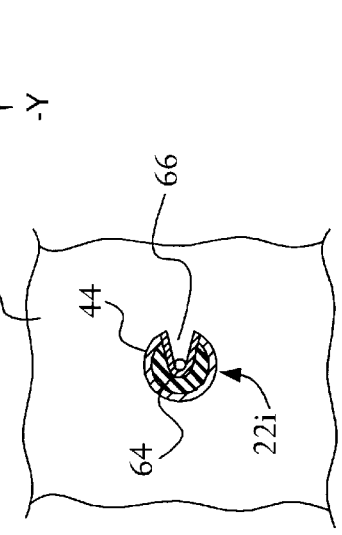
FIG. 11A
FIG. 11B
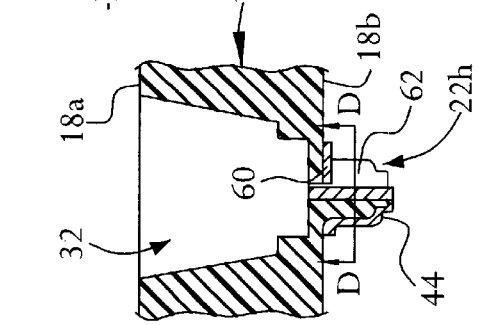
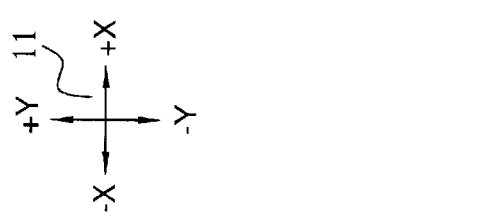
FIG. 12A
FIG. 12B

PIN-GRID-ARRAY ELECTRICAL CONNECTOR

FIELD OF THE INVENTION

The present invention relates to electrical connectors, and more particularly to high-density pin-grid-array (PGA) connectors.

BACKGROUND OF THE INVENTION

The ongoing drive to reduce the size of electronic equipment, and to add additional functions to such equipment has resulted in a steady increase in the densities of electronic circuits. These increases in circuit densities and functionality have decreased the surface area available for mounting electrical connectors on printed wireboards and other types of circuit substrates. This development has generated a need for multi-pin electrical connectors having minimally-spaced terminal pins. High-density PGA connectors have been developed in response to this need.

Ball-grid array (BGA) connectors are a commonly-used type of PGA connector. FIG. 13 depicts a conventional BGA connector 100. FIG. 13, and the other figures included herein, are each referenced to a common coordinate system 11. The connector 100 comprises a connector body 102 and a plurality of terminal pins 104. The connector body 102 has a plurality of through holes 106 formed therein for receiving the terminal pins 104.

The connector 100 is formed using a plurality of solder balls 108. The solder balls 108 form solder joints that secure the connector 100 to a substrate such as a printed wireboard (PWB) (not shown). The solder joints also establish electrical contact between the terminal pins 104 and respective electrical connection points on the PWB. Each solder ball 108 is aligned with a terminal pin 104 and a respective electrical connection point, and then reflowed to establish a solder joint that electrically and mechanically couples the terminal pin 104 and the electrical connection point.

Aligning and reflowing the solder balls 108 represents additional process steps in the production of the connector 100. Applicants have found that these process steps, while sufficient for their intended use, have certain limitations and disadvantages. For example, the need to align and reflow the solder balls 108 adds to the cost and time needed to manufacture the connector 100. In addition, Applicants have found that aligning and reflowing the solder balls 108 becomes more difficult as the density of the terminal pins 104 is increased. In particular, these process steps are not easily programmable into an automated manufacturing system.

Applicants have found that the need to align and reflow the solder balls 108 precludes the use of a relatively efficient stress-assisted soldering process when forming the solder joints between the terminal pins 104 and the electrical connection points. The use of the solder balls 108 also makes it difficult to produce the electrical connector 100 without the use of lead, thus rendering the electrical connector 100 unsuitable for use in a lead-free environment. In addition, power and ground islands cannot readily be formed in the electrical connector 100 because of the difficulty in forming the solder balls 108 into solder joints that span two or more of the terminal pins 104.

Applicants have also determined that achieving effective mechanical and electrical coupling between the terminal pins 104 and the respective electrical connection points requires a relatively high degree of co-planarity among the terminal pins 104, the connector body 102, and the PWB. Such co-planarity is often difficult to achieve in a production environment due to factors such as normal part-to-part variations, limitations in the precision with which the components can be positioned and aligned, etc.

An ongoing need therefore exists for a high-density PGA connector that can be electrically and mechanically coupled to a circuit substrate without the use of solder balls.

SUMMARY OF THE INVENTION

A presently-preferred electrical connector comprises a plurality of electrically-conductive terminal pins and an electrically-insulative connector body. The connector body comprises a first and a second substantially planar surface and a plurality of stud members projecting from the second substantially planar surface. The connector body has a plurality of through holes formed therein. The through holes each extend from the first substantially planar surface to a respective stud member and are each adapted to receive a respective one of the terminal pins. At least a portion of each of the stud members is coated with an electrically conductive material.

Another presently-preferred electrical connector comprises an electrically-conductive terminal pin comprising a tab portion and a contact portion extending from the tab portion. The electrical connector also comprises an electrically-insulative connector body comprising a substantially planar main portion having a first through hole formed therein for receiving at least the tab portion, and a stud member projecting from a surface of the main portion and having an outer surface and an inner surface. The inner surface defines one of a recess and a second through hole that adjoins the first through hole and is adapted to at least partially receive the contact portion. At least a portion of the outer and the inner surfaces are coated with a substantially contiguous layer of an electrically conductive material.

Another presently-preferred electrical connector comprises an electrically-insulative connector body comprising a substantially planar main portion, and a stud member projecting from a surface of the main portion and being at least partially coated with an electrically-conductive material. The connector body has a passage formed therein. The passage extends through the main portion and the stud member. The electrical connector also comprises an electrically-conductive terminal pin at least partially disposed in the passage and contacting the electrically-conductive material.

Another presently-preferred electrical connector comprises an electrically-conductive terminal pin, and an electrically-insulative connector body comprising a first and a second substantially planar surface and a stud member. The stud member projects from the second substantially planar surface and is adapted to be mounted on a circuit substrate. The connector body has a through hole formed therein. The through hole extends from the first substantially planar surface to the stud member and is adapted to receive the terminal pin. At least a portion of the stud member is coated with an electrically conductive material adapted to establish electrical contact between the terminal pin and an electrical connection point on the circuit substrate.

A presently-preferred electrical component comprises a circuit substrate having an associated electrical circuit and an electrical connection point. The electrical component further comprises an electrically-conductive terminal pin, and an electrically-insulative connector body. The connector body comprises a first and a second substantially planar surface, and a stud member projecting from the second substantially planar surface and being mounted on the circuit substrate. The connector body has a through hole formed therein. The through hole extends from the first substantially planar surface to the stud member and is adapted to receive at least a portion of the terminal pin. The electrical component further comprises a layer of electrically conductive material disposed on at least a portion of the stud member to establish electrical contact between the terminal pin and the electrical connection point.

BRIEF DESCRIPTION OF THE DRAWINGS

For the purpose of illustrating the invention, the drawings show an embodiment that is presently preferred. The invention is not limited, however, to the specific instrumentalities disclosed in the drawings. In the drawings:

FIG. 10A is a cross-sectional side view of another alternative embodiment of the connector body shown in FIGS. 2A–2D;

FIG. 10B is a cross-sectional bottom view of a stud member of the connector body shown in FIG. 10A, taken along the line "D—D" of FIG. 10A;

FIG. 11A is a cross-sectional side view of another alternative embodiment of the connector body shown in FIGS. 2A–2D;

FIG. 11B is a cross-sectional bottom view of a stud member of the connector body shown in FIG. 10A, taken along the line "E—E" of FIG. 11A;

FIG. 12A is a cross-sectional side view of another alternative embodiment of the connector body shown in FIGS. 2A–2D;

FIG. 12B is a cross-sectional bottom view of a stud member of the connector body shown in FIG. 10A, taken along the line "F—F" of FIG. 12A.

DESCRIPTION OF PREFERRED EMBODIMENTS

Figure 1:
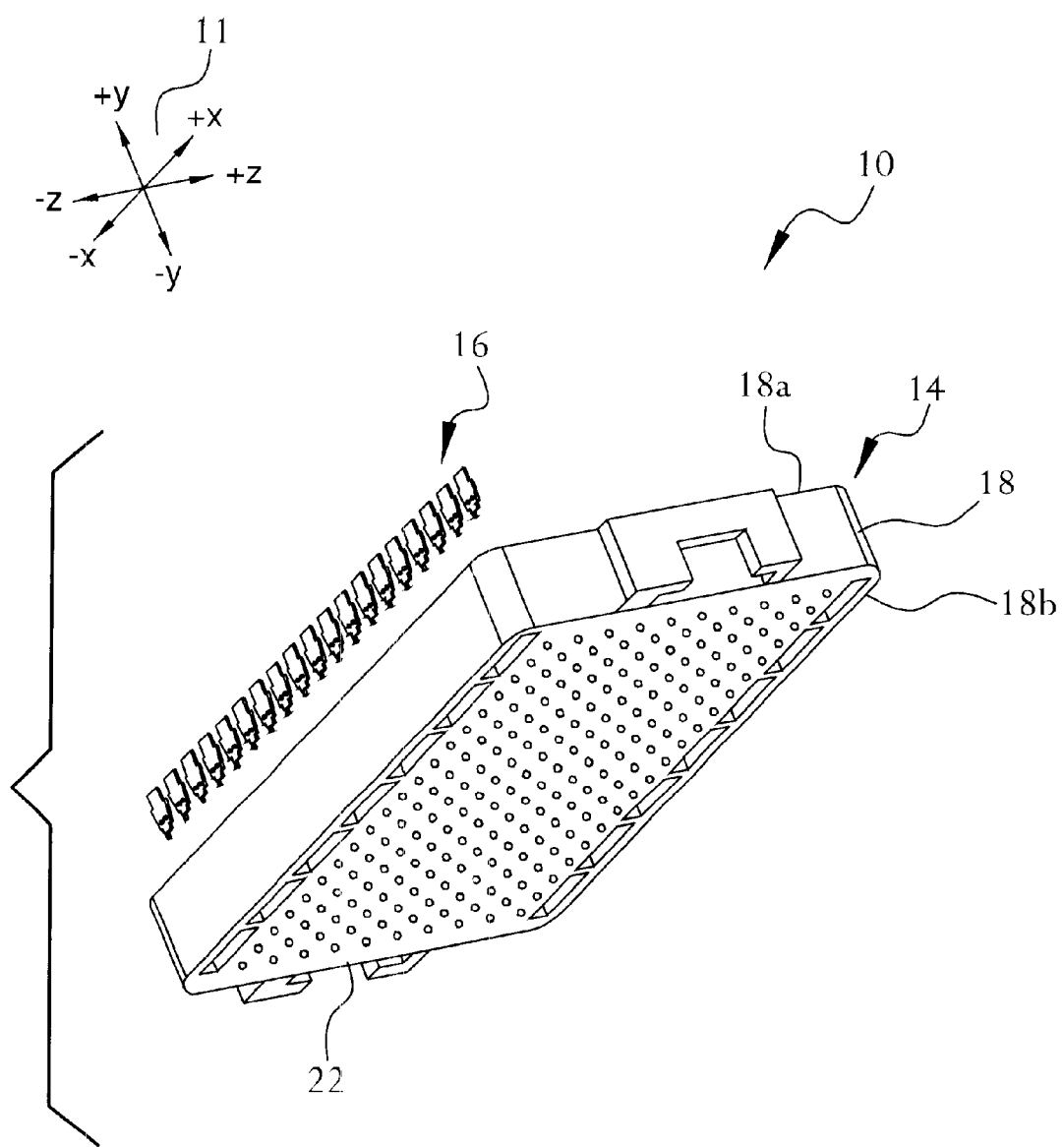
FIG. 1 is an exploded, bottom perspective view of a presently-preferred electrical connector.
Figure 2A:
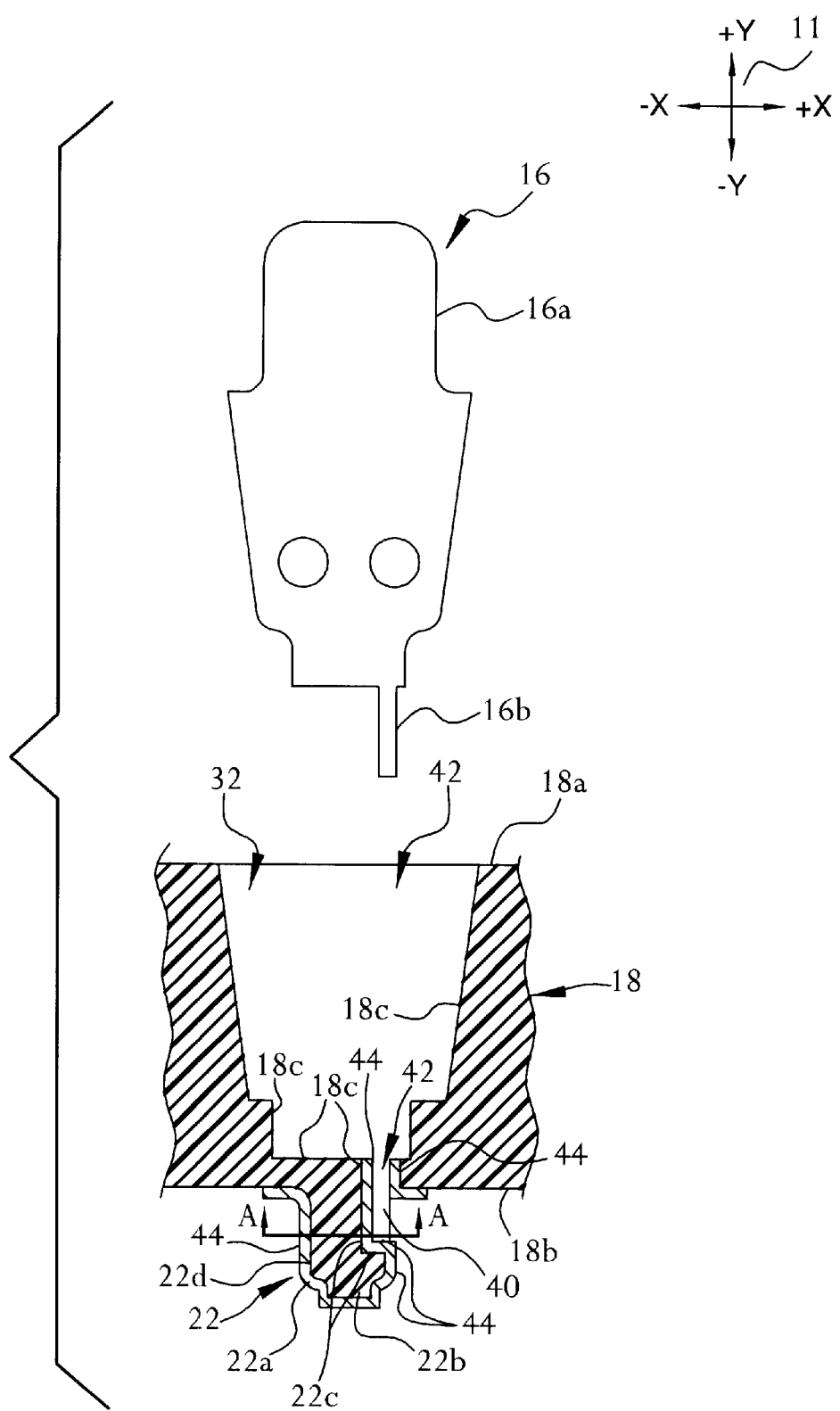
FIG. 2A is an exploded side view of a terminal pin and a connector body of the electrical connector shown in FIG. 1.
Figure 2B:
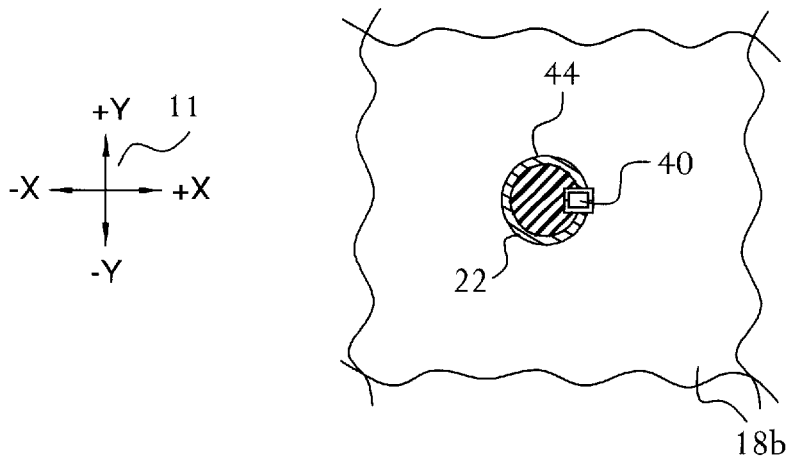
FIG. 2B is a bottom cross-sectional view of a stud member of the connector body shown in FIG. 2A, taken along the line "A—A" of FIG. 2A.
Figure 2C:
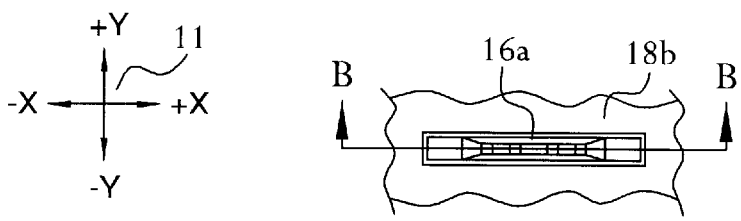
FIG. 2C is a partial top view of the terminal pin and connector body shown in FIGS. 2A and 2B.
Figure 2D:
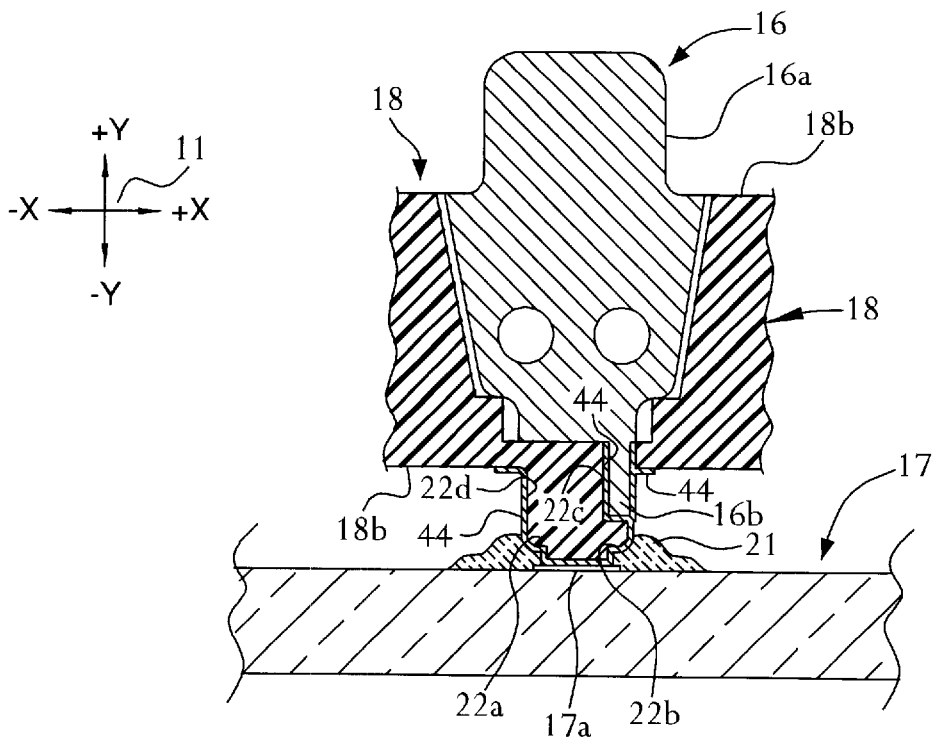
FIG. 2D is a cross-sectional side view of the terminal pin and connector body shown in FIGS. 2A–2C, in an assembled state, taken along the line B—B of FIG. 2C.

FIGS. 1–2D depict a presently-preferred electrical connector 10. The figures are each referenced to a common coordinate system 11 depicted therein. The electrical connector 10 comprises a connector body 14 and a plurality of terminal pins 16 that together form a high-density pin-grid array. The electrical connector 10 is adapted to establish electrical contact between an circuit substrate such as a printed wireboard (PWB) 17, and an electrical component or a second circuit substrate (not shown).

The connector body 14 comprises a main portion 18 having a substantially planar first surface 18a and a substantially planar second surface 18b. The connector body 14 further comprises a plurality of stud members 22 projecting from the second surface 18b. The stud members 22 and the main portion 18 are formed from an insulative material such a plastic, and most preferably are formed from liquid crystal polymer (LCP). The stud members 22 and the main portion 18 are preferably formed on a unitary basis.

Each stud member 22 preferably has a substantially circular cross-section (see FIG. 2B). The stud members 22 each include an end portion having a rounded edge 22a, and having a button 22b formed thereon (FIGS. 2A and 2D). Each stud member 22 has an inner, or recessed surface portion 22c that defines a recess 40. The significance of these features is explained below.

A plurality of through holes 32 are formed in the connector body 14 (see FIG. 2A). Each through hole 32 is defined by a respective surface portion 18c in the main portion 18. The through holes 32 each extend from the first surface 18a to a respective stud member 22. Each through hole 32 adjoins a respective recess 40. Each corresponding through hole 32 and recess 40 form a passage 42 that extends through the main portion 18 and the respective stud member 22. The passage 42 is adapted to receive at least a portion of a respective terminal pin 16. Further details concerning the passage 42 are presented below.

The surface portion 18c and the stud members 22 are at least partially covered with a conductive coating 44. (The thickness of the conductive coating is exaggerated in the figures, for clarity.) The conductive coating 44 is a metallized layer that establishes electrical contact between a respective terminal pin 16 and the PWB 17, as explained in detail below. The coating 44 is preferably formed from copper (Cu), nickel (Ni), and tin (Sn). The coating 44 is applied by activating the second surface 18b of the main portion 18, and a lower end of the surface portion 18c with electroless CU. The recessed surface portion 22c of the stud members 22 are also activated with the electroless CU. A 20–25-micron layer of electrolytic CU, a 4–6-micron layer of electrolytic Ni, and a 4–6 micron layer of electrolytic Sn are then sequentially applied to the activated areas.

A substantial portion of the Sn layer located on the second surface 18b is subsequently removed by laser oblation, and the underling layers of Cu and Ni are removed by chemical etching. The coating 44 that remains after this process forms a substantially contiguous metallized layer on and immediately surrounding each stud member 22. In particular, the coating 44 associated with each stud member 22 covers an outer surface 22d and the recessed surface portion 22c of the stud member 22, a portion of the second surface 18b immediately adjacent the outer surface 22d, and the lower end of each surface portion 18c (see FIGS. 2A and 2D).

It should be noted that specific details relating to the composition and application of the coating 44 are presented for exemplary purposes only; the coating 44 can be formed from virtually any type of suitable conductive material applied in any conventional manner.

The terminal pins 16 are each formed from a conductive material such as BeCu or phosphor bronze. Each terminal pin 16 comprises a tab portion 16a and an elongated contact portion 16b extending from the tab portion 16a. The contact portion 16b preferably has a substantially rectangular cross-section (other cross-sectional shapes, e.g., circular or conical, can also be used). A centerline of the contact portion 16b is preferably offset from a centerline of the tab portion 16a, as shown in FIGS. 2A and 2D.

The passages 42 are each adapted to receive at least a portion of a respective terminal pin 16, as noted above. More particularly, the recess 40 and a lower portion of the through hole 32 are adapted to receive the contact portion 16b, and a remainder of the through hole 32 is adapted to receive a part of the tab portion 16a (see FIG. 2D). A remainder of the tab portion 16a extends upwardly, away from the first surface 18a of the connector body 14, and is adapted to mate with and electrically contact an electrical component or a second circuit substrate. A minimal clearance, e.g., 0.001 inch, preferably exists between the contact portion 16b and the coating 44 when the terminal pin 16 is positioned in the passage 42.

The PWB 17 includes a plurality of electrical traces that each terminate in a respective electrical connection point 17a (ses FIG. 2D). The electrical connector 10 is mechanically and electrically coupled to the PWB 17 by a mass soldering process, e.g., wave soldering, that forms a solder joint 21 between each stud member 22 and a corresponding electrical connection point 17a.

The mechanical and electrical connections between the electrical connector 10 and the PWB 17 are facilitated by the conductive coating 44. More specifically, the solder joint 21 securely bonds the electrical connection point 17a to the conductive coating 44 on a respective stud member 22, thereby securing the electrical connector 10 to the PWB 17. Furthermore, the conductive coating 44, in conjunction with the solder joint 21, forms an electrically-conductive path between the electrical connection point 17a and the contact portion 16b of the terminal pin 16. It should be noted that the use of the passages 42 extending into and through the stud member 22 and accommodating the terminal pin 16 distinguishes the presently-preferred embodiment from other devices that incorporate metallized projections or protrusions for conducting electrical current.

The mechanical bond between the electrical connector 10 and the PWB 17 is enhanced by the geometry of the stud members 22. In particular, the solder joint 21 formed during the mass soldering process circumscribes the rounded edge 22a and the button 22b of each stud member 22. The rounded edge 22a and the button 22b increase the contact area between the solder joint 21 and the stud member 22, and thereby increase the lateral ("x" and "z" direction) restraining force which the solder joint 21 is capable of exerting on the stud member 22.

The soldering process also secures each terminal pin 16 to the connector body 14. More specifically, solder flows into the recess 40 and the lower portion of the through hole 32 during the soldering process, substantially filling the clearance between the contact portion 16b and the conductive coating 44. The solder, upon cooling, forms a bond between the contact portion 16b and the coating 44, thereby securing the terminal pin 16 to the connector body 14.

The electrical connector 10 provides substantial advantages in relation to conventional BGA connectors. For example, the electrical connector 10 comprises only two major components: the connector body 14 and the terminal pins 16. A conventional BGA connector, by contrast, requires some type of housing or body, terminal pins, and a plurality of solder balls each associated with one of the terminal pins. The solder balls must be positioned and reflowed during production of a conventional BGA connector. These process steps are not necessary in the production of an electrical connector such as the electrical connector 10, thereby leading to substantial savings in production costs.

Furthermore, effective electrical and mechanical coupling of the terminal pins 16 and the PWB 17 can be achieved without the need for a relatively high degree of co-planarity among the terminal pins 16, the connector body 14, and the PWB 17. This substantial advantage results from the arrangement of the stud members 22, the contact portions 16b, and the PWB 19. In particular, the terminal pins 16 are not fixed directly to the PWB 19. The terminal pins 16 are mechanically and electrically coupled to the PWB 19 via the stud members 22, the conductive coating 44, and the solder joints 21. Hence, substantial variations in the vertical ("y"-dimension) spacing between the contact portions 16b and the respective electrical connection points 17a can occur without substantially affecting the electrical or mechanical coupling of the terminal pins 16 and the PWB 17. In other words, precision vertical positioning of the terminal pins 16 within the connector body 14 is not required to establish effective electrical and mechanical coupling between the terminal pins 16 and the PWB 17.

The production process for the electrical connector 10 can be programmed into and implemented on an automated manufacturing system more easily than the production process for a conventional BGA connector, thus leading to further savings in production costs.

Figure 3:
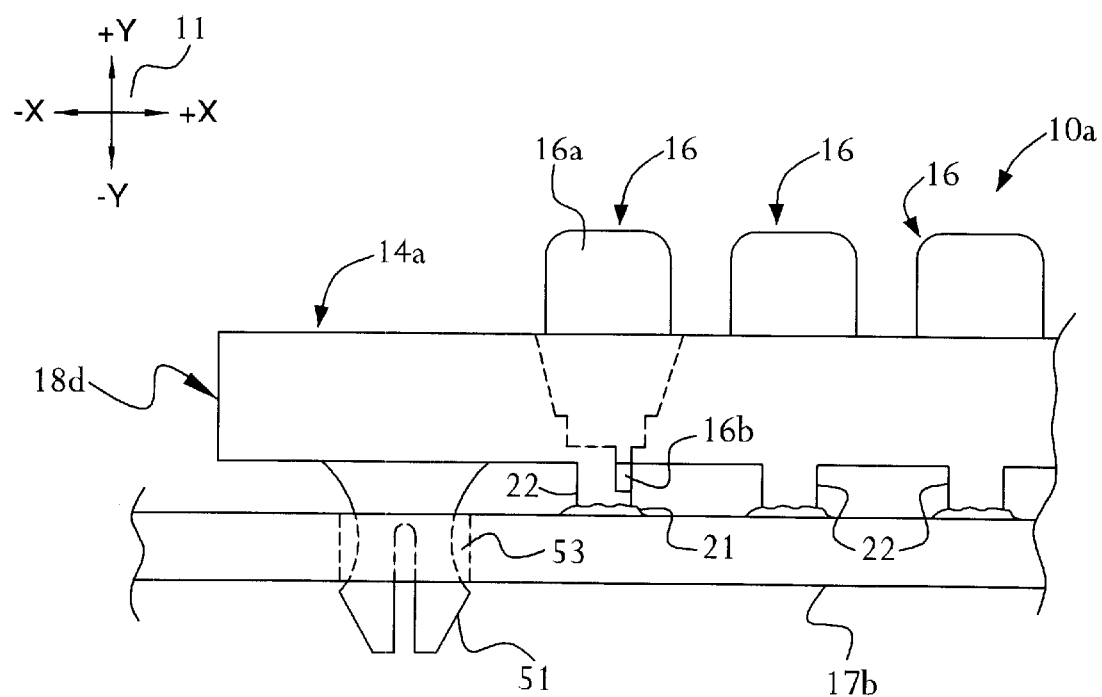
FIG. 3 is a side view of an alternative embodiment of the electrical connector shown in FIG. 1.

An efficient stress-assisted soldering process can be used to join the electrical connector 10 to the PWB 17 (this type of soldering process is not feasible when reflowing the solder balls of a conventional ball-grid-array connector, as noted previously). For example, FIG. 3 depicts an alternative embodiment in the form of an electrical connector 10a. Components of the connector 10a that are substantially identical to those of the connector 10 are denoted by common reference numerals. The electrical connector 10a comprises a connector body 14a comprising a main portion 18d having mounting pegs 51 projecting therefrom. The mounting pegs 51 are adapted to securely engage a PWB 17b via through holes 53 formed therein, thus securing the connector body 14a to the PWB 17b and facilitating the stress-assisted soldering process.

Figure 4:
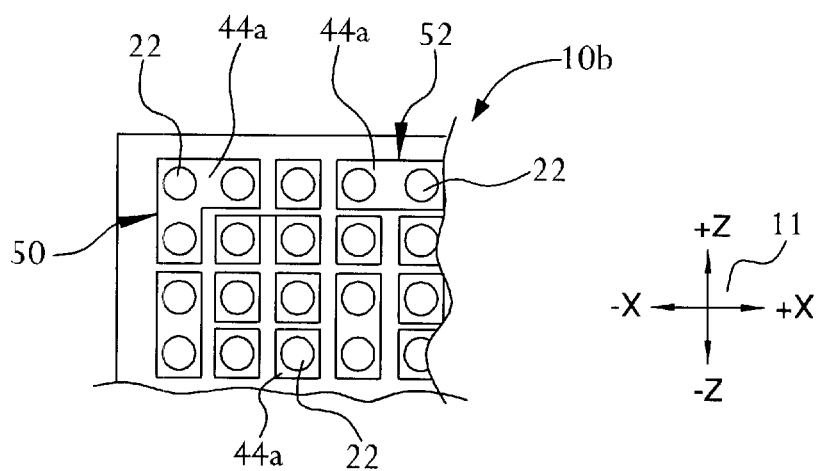
FIG. 4 is a bottom view of another alternative embodiment of the electrical connector shown in FIG. 1.

The electrical connector 10 can be produced without the use of lead, thus making the electrical connector 10 suitable for use in a lead-free environment. Furthermore, power and ground islands can readily be formed in the electrical connector 10. For example, FIG. 4 depicts an alternative embodiment in the form of an electrical connector 10b. Components of the connector 10b that are substantially identical to those of the connector 10 are denoted by common reference numerals. The electrical connector 10b includes a coating 44a that electrically couples adjacent terminal pins 16 on a selective basis. In particular, the coating 44*a* electrically couples adjacent terminal pins that act as grounding pins, and thereby forms a ground island 50. The coating 44*a* also electrically couples adjacent terminal pins that act as power pins, and thereby forms a power island 52.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of the parts, within the principles of the invention to the full extent indicated by the broad general meaning of the terms in which the appended claims are expressed.

Figure 5A:
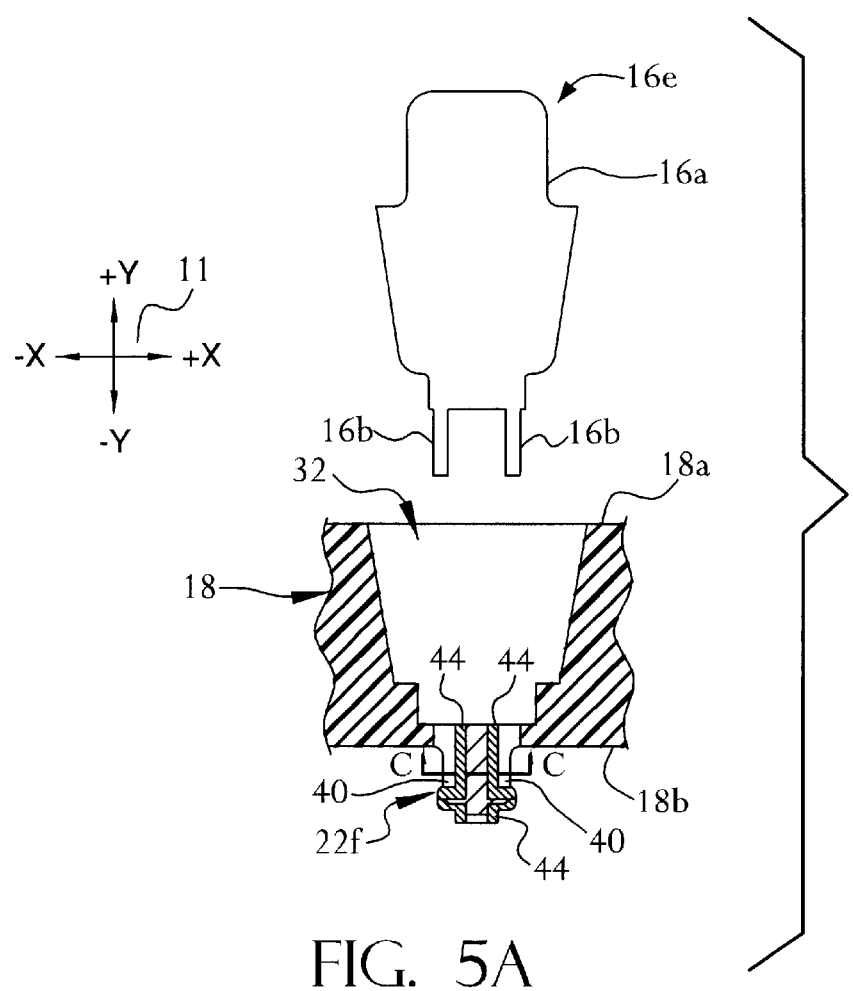
FIG. 5A is an exploded side view of an alternative embodiment of the terminal pin and connector body shown in FIGS. 2A–2D.
Figure 5B:
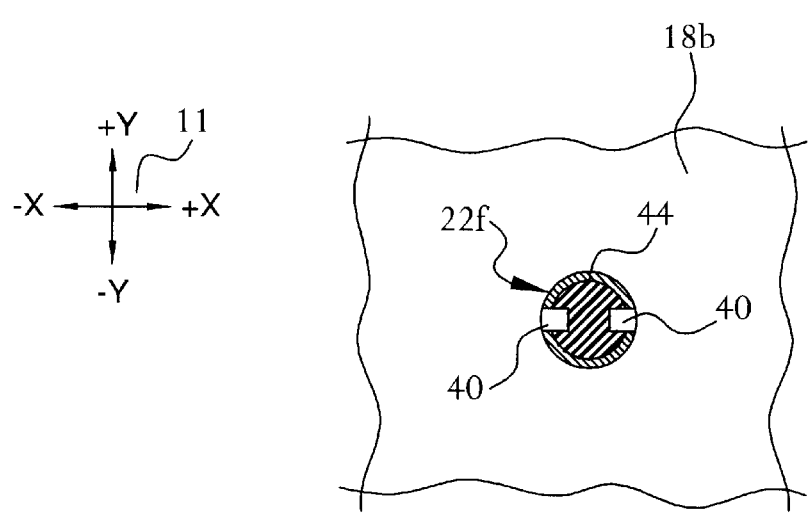
FIG. 5B is a bottom cross-sectional view of a stud member of the connector body shown in FIG. 5A, taken along the line "C—C" of FIG. 5A.

For example, FIGS. 5A and 5B depict a terminal pin 16*e* having two of the contact portions 16*b*, and a stud member 22*f* having two of the recesses 40 formed therein to receive the two contact portions 16*b* (common reference numerals are used herein to denote components that are substantially identical to those of the electrical connector 10).

Figure 6:
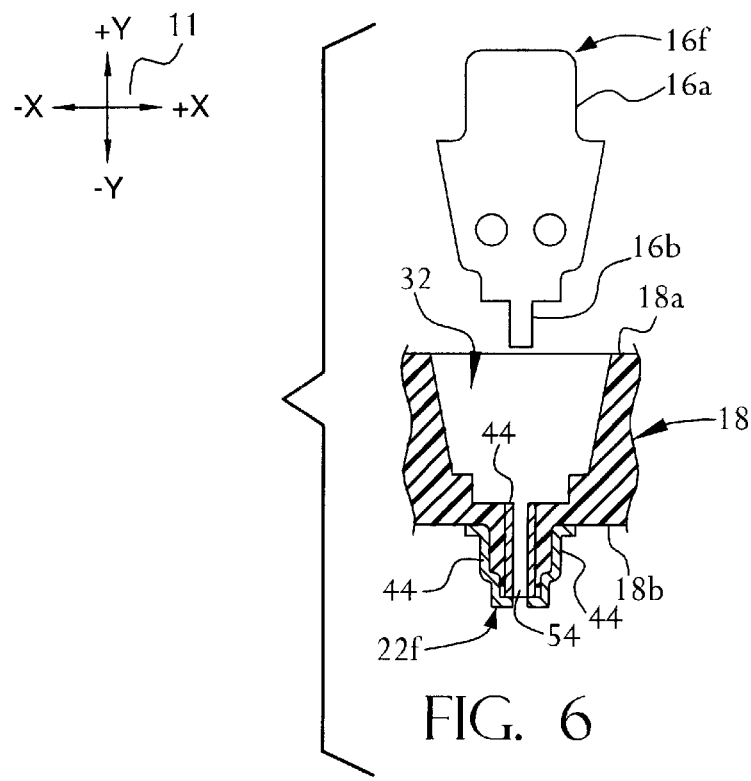
FIG. 6 is an exploded side view of another alternative embodiment of the terminal pin and connector body shown in FIGS. 2A–2D.
Figure 7:
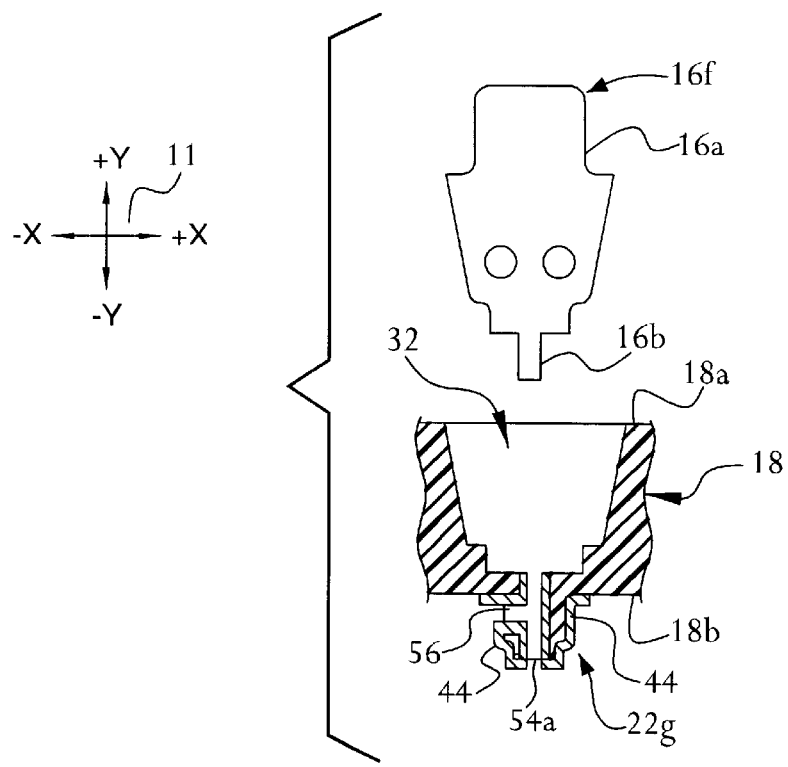
FIG. 7 is an exploded side view of another alternative embodiment of the terminal pin and connector body shown in FIGS. 2A–2D.

FIG. 6 depicts a terminal pin 16*f* having one of the contact portions 16*b* centrally formed therein, i.e., a central axis of the contact portion 16*b* is substantially aligned with a central axis of the tab portion 16*a*. FIG. 6 also depicts a stud member 22*f* having a centrally-located through hole 54 adapted to receive the contact portion 16*b* of the terminal pin 16*f*. FIG. 7 depicts the terminal pin 16*f*, and a stud member 22*g* having a centrally-located through hole 54*a* and a recess 56 that adjoins the through hole 54*a*.

Figure 9:
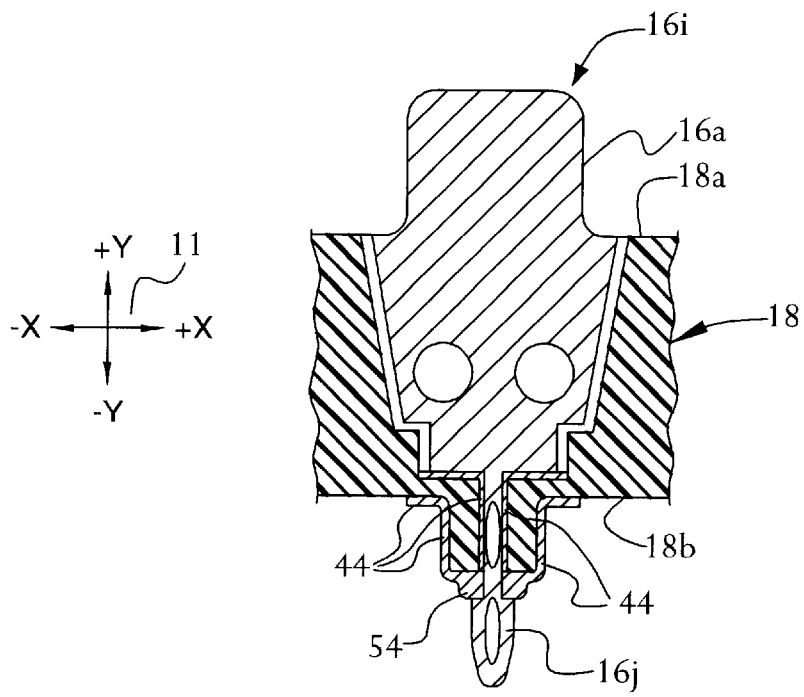
FIG. 9 is a cross-sectional side view of another alternative embodiment of the terminal pin shown in FIGS. 2A–2D.
Figure 8:
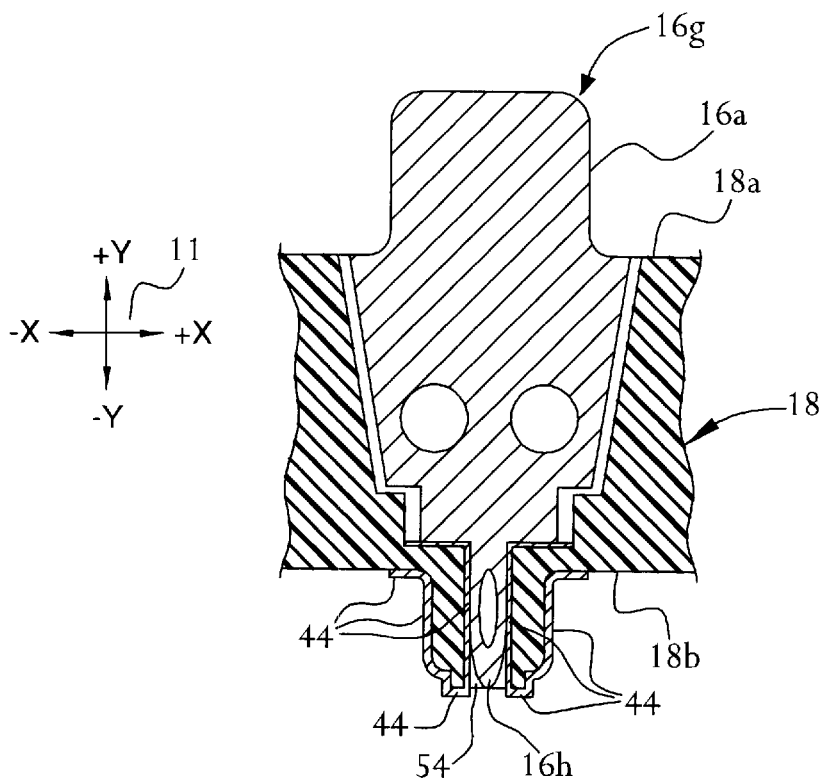
FIG. 8 is a cross-sectional side view of another alternative embodiment of the terminal pin shown in FIGS. 2A–2D.
Figure 13:
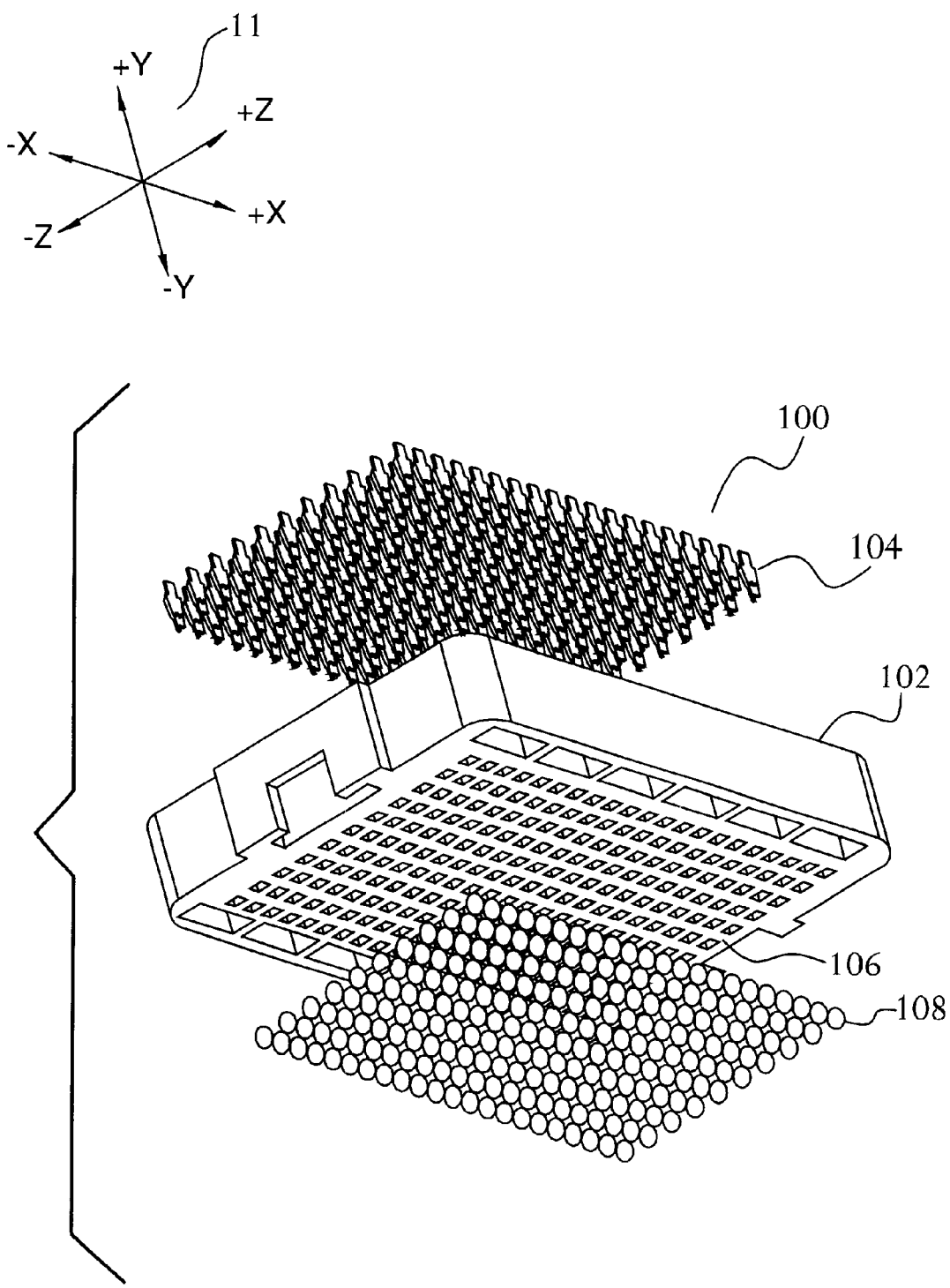
FIG. 13 is an exploded, bottom perspective view of a conventional BGA connector.

FIG. 8 depicts a terminal pin 16*g* having a centrally-located, press-fit contact portion 16*h*, and the stud member 22*f* having the centrally-located through hole 54. FIG. 9 depicts a terminal pin 16*i* having a centrally-located, double-press-fit contact portion 16*j*, and the stud member 22*f*.

FIGS. 10A and 10B depict a stud member 22*h* having a through hole 60 and an adjoining slot 62 formed therein. FIGS. 11A and 11B depict a stud member 22*i* having a through hole 64 and an adjoining open segment 66 formed therein. FIGS. 12A and 12B depict a stud member 22*j* having a through hole 68 formed therein. The through hole 68 has a substantially circular cross section, and is adapted to receive a contact portion having a similarly-shaped cross-section.

What is claimed is:

1. An electrical connector, comprising:
   a plurality of electrically-conductive terminals; and
   an electrically-insulative connector body comprising a first and a second substantially planar surface and a plurality of stud members projecting from the second substantially planar surface, wherein the connector body has a plurality of through holes formed therein, the through holes each extend from the first substantially planar surface, and each receive at least a portion of a respective one of the terminals, an outer surface of each of the stud members is coated with an electrically conductive material, and each of the terminals extends into a respective one of the stud members by way of one of a recess and a through hole formed in the respective one of the stud members and adjoining a respective one of the through holes formed in the connector body.

2. The electrical connector of claim 1, wherein the one of a recess and a through hole formed in a respective stud member receives at least a portion of a respective one of the terminals.

3. The electrical connector of claim 1, wherein the conductive coating is disposed within at least a portion of each of the one of a recess and a through hole formed in a respective stud member.

4. The electrical connector of claim 1, wherein the connector body is formed from liquid crystal polymer.

5. The electrical connector of claim 1, wherein the terminals each comprise a tab portion and a contact portion, the contact portion is adapted to contact the electrically conductive material, and a centerline of the contact portion is substantially aligned with a centerline of the tab portion.

6. The electrical connector of claim 1, wherein an end of the stud member has a substantially rounded edge.

7. The electrical connector of claim 1, wherein the stud member has a button formed on an end thereof.

8. The electrical connector of claim 5, wherein the contact portion of each of the terminals has a substantially rectangular cross section.

9. The electrical connector of claim 5, wherein the plurality of terminals each comprise no more than one of the contact portions.

10. The electrical connector of claim 1, wherein the conductive coating comprises copper, nickel, and tin.

11. The electrical connector of claim 10, wherein the conductive coating comprises a layer of the copper approximately twenty to approximately twenty-five microns thick, a layer of the nickel approximately four to approximately six microns thick, and a layer of the tin approximately four to approximately six microns thick.

12. An electrical connector, comprising:
    an electrically-conductive terminal pin comprising a tab portion and a contact portion extending from the tab portion; and
    an electrically-insulative connector body comprising:
       a substantially planar main portion having a first through hole formed therein for receiving at least the tab portion; and
       a stud member projecting from a surface of the main portion and having an outer surface and an inner surface, the inner surface defining one of a recess and a second through hole that adjoins the first through hole and is adapted to at least partially receive the contact portion, wherein at least a portion of the outer and the inner surfaces are coated with a substantially contiguous layer of an electrically conductive material.

13. An electrical connector, comprising:
    an electrically-insulative connector body comprising a substantially planar main portion and a stud member projecting from a surface of the main portion, an outer surface of the stud member being coated with an electrically-conductive material, the connector body having a passage formed therein, the passage extending through the main portion and the stud member and comprising a through hole formed in the main portion and an adjoining recess formed in the stud member; and
    an electrically-conductive terminal at least partially disposed in the passage and contacting the electrically-conductive material.

14. An electrical component, comprising:
    a circuit substrate having an associated electrical circuit and an electrical connection point;
    an electrically-conductive terminal;
    an electrically-insulative connector body comprising a first and a second substantially planar surface and a stud member projecting from the second substantially planar surface and being mounted on the circuit substrate, wherein the connector body has a through hole formed therein, the through hole extends from the first substantially planar surface, and receives at least a portion of the terminal, and the terminal extends into a respective one of the stud members by way of one of a recess and a through hole formed in the respective one of the stud members and adjoining a respective one of the through holes formed in the connector body; and a layer of electrically conductive material disposed on an outer surface of the stud member to establish electrical contact between the terminal and the electrical connection point.

15. The electrical component of claim 14, wherein the stud member is soldered to the circuit substrate.

16. The electrical component of claim 14, wherein the circuit substrate is a printed wireboard.

17. The electrical component of claim 14, wherein the one of a recess and a through hole formed in a respective stud member receives at least a portion of the terminal.

18. An electrical connector, comprising:

a plurality of electrically-conductive terminals each comprising a tab portion and a contact portion; and an electrically-insulative connector body comprising a first and a second substantially planar surface and a plurality of stud members projecting from the second substantially planar surface, wherein the connector body has a plurality of through holes formed therein, the through holes each extend from the first substantially planar surface and adjoin one of a recess and a through hole formed in a respective stud member, and each receive a respective one of the terminals, at least a portion of each of the stud members is coated with an electrically conductive material, and the contact portion of each of the terminals contacts the electrically conductive material on and extends into a respective one of the stud members.

19. An electrical connector, comprising:

a plurality of electrically-conductive terminals pins; and an electrically-insulative connector body comprising a first and a second substantially planar surface, a mounting peg for securely engaging a through hole on a circuit substrate, and a plurality of stud members projecting from the second substantially planar surface, wherein the connector body has a plurality of through holes formed therein, the through holes each extend from the first substantially planar surface, and each receive a respective one of the terminals, and at least a portion of each of the stud members is coated with an electrically conductive material, and each of the terminals extends into a respective one of the stud members by way of one of a recess and a through hole formed in the respective one of the stud members and adjoining a respective one of the through holes formed in the connector body.

20. An electrical connector, comprising a plurality of electrically-conductive terminals each comprising a tab portion and a contact portion, and an electrically-insulative connector body comprising a first and a second substantially planar surface and a plurality of stud members projecting from the second substantially planar surface, wherein:

the connector body has a plurality of through holes formed therein;

the through holes each extend from the first substantially planar surface, each adjoin one of a recess and a through hole formed in a respective stud member, and each receive at least a portion of a respective one of the terminals;

at least an outer surface of each of the stud members is coated with an electrically conductive material;

the contact portion of each of the terminals contacts the electrically conductive material; and a centerline of the contact portion and a centerline of a tab portion of each of the terminals are substantially aligned.

21. An electrical connector, comprising a plurality of electrically-conductive terminals each comprising a tab portion and a contact portion, and an electrically-insulative connector body comprising a first and a second substantially planar surface and a plurality of stud members projecting from the second substantially planar surface, wherein:

the connector body has a plurality of through holes formed therein;

the through holes each extend from the first substantially planar surface, each adjoin a recess formed in a respective stud member, and each receive at least a portion of a respective one of the terminals;

at least an outer surface of each of the stud members is coated with an electrically conductive material;

the contact portion of each of the terminals contacts the electrically conductive material;

a centerline of the contact portion and a centerline of a tab portion of each of the terminals are substantially offset; and each of the recesses receives the contact portion of a respective one of the terminals.

22. An electrical connector, comprising a plurality of electrically-conductive terminals each comprising a tab portion and a contact portion, and an electrically-insulative connector body comprising a first and a second substantially planar surface and a plurality of stud members projecting from the second substantially planar surface, wherein:

the connector body has a plurality of through holes formed therein;

the through holes each extend from the first substantially planar surface, each adjoin a recess formed in a respective stud member, and each receive at least a portion of a respective one of the terminals;

an outer surface of each of the stud members is coated with an electrically conductive material;

each of the recesses receives at least a portion of a respective one of the terminals; and the recesses are each defined by a respective recessed surface portion at least partially covered by the conductive coating.

* * * * *

UNITED STATES PATENT AND TRADEMARK OFFICE
CERTIFICATE OF CORRECTION

PATENT NO.    : 6,638,082 B2
DATED         : October 28, 2003
INVENTOR(S)   : Yakov Belopsky et al.

It is certified that error appears in the above-identified patent and that said Letters Patent is hereby corrected as shown below:

Column 9,
Line 40, the word "pins" should be deleted.
Line 49, the word "and" should be deleted.

Signed and Sealed this

Tenth Day of August, 2004

JON W. DUDAS
*Acting Director of the United States Patent and Trademark Office*